United States Patent
Dunn

(10) Patent No.: US 8,854,572 B2
(45) Date of Patent: Oct. 7, 2014

(54) SYSTEM FOR USING CONSTRICTED CONVECTION WITH CLOSED LOOP COOLING SYSTEM AS THE CONVECTION PLATE

(71) Applicant: Manufacturing Resources International, Inc., Alpharetta, GA (US)

(72) Inventor: William R. Dunn, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 13/937,777

(22) Filed: Jul. 9, 2013

(65) Prior Publication Data

US 2014/0111940 A1 Apr. 24, 2014

Related U.S. Application Data

(63) Continuation of application No. 13/605,530, filed on Sep. 6, 2012, now Pat. No. 8,482,695, which is a continuation of application No. 12/620,330, filed on (Continued)

(51) Int. Cl.
- *G02F 1/1333* (2006.01)
- *H05K 7/20* (2006.01)

(52) U.S. Cl.
CPC ........ *H05K 7/20136* (2013.01); *H05K 7/20972* (2013.01); *G02F 1/133385* (2013.01)
USPC .............................. 349/58; 361/690; 361/695

(58) Field of Classification Search
None
See application file for complete search history.

(56) References Cited

U.S. PATENT DOCUMENTS

| | | |
|---|---|---|
| 4,093,355 A | 6/1978 | Kaplit et al. |
| 4,593,978 A | 6/1986 | Mourey et al. |

(Continued)

FOREIGN PATENT DOCUMENTS

| | | |
|---|---|---|
| GB | 2402205 | 1/2004 |
| JP | 03153212 | 7/1991 |

(Continued)

OTHER PUBLICATIONS

Zeef, Hubing, EMC analysis of 18' LCD Monitor, Aug. 2000, 1 page.

*Primary Examiner* — Richard Kim
(74) *Attorney, Agent, or Firm* — Standley Law Group LLP

(57) ABSTRACT

A method for cooling an electronic display is disclosed herein. The electronic display preferably contains a rear surface, where a substantially planar surface is positioned adjacent to the rear surface to define a gap. Cooling air is preferably forced through said gap. In some embodiments, the additional step of circulating gas around the display in a closed loop may also be performed. In these embodiments the circulating gas may contact the front viewing surface of the electronic display, so that heat can be removed from this surface.

20 Claims, 3 Drawing Sheets

Related U.S. Application Data

Nov. 17, 2009, now Pat. No. 8,274,622, which is a continuation-in-part of application No. 12/234,307, filed on Sep. 19, 2008, now Pat. No. 8,767,165, said application No. 12/620,330 is a continuation-in-part of application No. 12/234,360, filed on Sep. 19, 2008, said application No. 12/620,330 is a continuation-in-part of application No. 12/237,365, filed on Sep. 24, 2008, said application No. 12/620,330 is a continuation-in-part of application No. 12/411,925, filed on Mar. 26, 2009, said application No. 12/620,330 is a continuation-in-part of application No. 12/235,200, filed on Sep. 22, 2008, said application No. 12/620,330 is a continuation-in-part of application No. 12/556,029, filed on Sep. 9, 2009, now Pat. No. 8,373,841.

(60) Provisional application No. 61/115,333, filed on Nov. 17, 2008, provisional application No. 61/033,064, filed on Mar. 3, 2008, provisional application No. 61/053,713, filed on May 16, 2008, provisional application No. 61/057,599, filed on May 30, 2008, provisional application No. 61/039,454, filed on Mar. 26, 2008, provisional application No. 61/076,126, filed on Jun. 26, 2008, provisional application No. 61/095,615, filed on Sep. 9, 2008.

(56) References Cited

U.S. PATENT DOCUMENTS

| | | | |
|---|---|---|---|
| 4,634,225 | A | 1/1987 | Haim et al. |
| 5,029,982 | A | 7/1991 | Nash |
| 5,088,806 | A | 2/1992 | McCartney et al. |
| 5,247,374 | A | 9/1993 | Terada |
| 5,559,614 | A | 9/1996 | Urbish et al. |
| 5,748,269 | A | 5/1998 | Harris et al. |
| 5,767,489 | A | 6/1998 | Ferrier |
| 5,818,010 | A | 10/1998 | McCann |
| 5,869,919 | A | 2/1999 | Sato |
| 5,991,153 | A | 11/1999 | Heady et al. |
| 6,089,751 | A | 7/2000 | Conover et al. |
| 6,157,432 | A | 12/2000 | Helbing |
| 6,191,839 | B1 | 2/2001 | Briley |
| 6,392,727 | B1 | 5/2002 | Larson et al. |
| 6,417,900 | B1 | 7/2002 | Shin et al. |
| 6,493,440 | B2 * | 12/2002 | Gromatzky et al. .......... 379/161 |
| 6,535,266 | B1 | 3/2003 | Nemeth et al. |
| 6,628,355 | B1 | 9/2003 | Takahara |
| 6,839,104 | B2 | 1/2005 | Taniguchi et al. |
| 6,885,412 | B2 | 4/2005 | Ohnishi et al. |
| 6,909,486 | B2 | 6/2005 | Wang et al. |
| 6,943,768 | B2 | 9/2005 | Cavanaugh et al. |
| 6,961,108 | B2 | 11/2005 | Wang et al. |
| 7,059,757 | B2 | 6/2006 | Shimizu |
| 7,083,285 | B2 | 8/2006 | Hsu |
| 7,602,469 | B2 | 10/2009 | Shin |
| 7,667,964 | B2 * | 2/2010 | Kang et al. .................... 361/692 |
| 8,269,916 | B2 | 9/2012 | Ohkawa |
| 2002/0101553 | A1 | 8/2002 | Enomoto et al. |
| 2002/0126248 | A1 | 9/2002 | Yoshida |
| 2003/0007109 | A1 | 1/2003 | Park |
| 2004/0036834 | A1 | 2/2004 | Ohnishi et al. |
| 2004/0165139 | A1 | 8/2004 | Anderson et al. |
| 2006/0132699 | A1 | 6/2006 | Cho et al. |
| 2006/0209266 | A1 | 9/2006 | Utsunomiya |
| 2007/0065091 | A1 | 3/2007 | Hinata |
| 2007/0151664 | A1 | 7/2007 | Shin |
| 2010/0171889 | A1 | 7/2010 | Pantel |

FOREIGN PATENT DOCUMENTS

| | | |
|---|---|---|
| JP | 08194437 | 7/1996 |
| JP | 11160727 | 6/1999 |
| JP | 2002158475 | 5/2002 |
| JP | 2005134849 | 5/2005 |
| JP | 200829274 | 12/2008 |
| KR | 20060016469 | 2/2006 |
| KR | 100666961 | 1/2007 |
| KR | 1020070070675 | 7/2007 |
| WO | WO2005079129 | 8/2005 |

* cited by examiner

SYSTEM FOR USING CONSTRICTED CONVECTION WITH CLOSED LOOP COOLING SYSTEM AS THE CONVECTION PLATE

CROSS-REFERENCE TO RELATED APPLICATIONS

This application is a continuation of and claims priority to U.S. application Ser. No. 13/605,530 filed on Sep. 6, 2012. U.S. application Ser. No. 13/605,530 is a continuation of U.S. application Ser. No. 12/620,330 filed on Nov. 17, 2009. U.S. application Ser. No. 12/620,330 is a non-provisional application of U.S. Application No. 61/115,333 filed Nov. 17, 2008. U.S. application Ser. No. 12/620,330 is also continuation-in-part of U.S. application Ser. No. 12/411,925 filed Mar. 26, 2009, which is a non-provisional application of U.S. Provisional Application No. 61/039,454 filed Mar. 26, 2008. U.S. application Ser. No. 12/620,330 is also a continuation-in-part of U.S. application Ser. No. 12/556,029 filed Sep. 9, 2009, which is a non-provisional application of U.S. Provisional Application No. 61/095,615 filed Sep. 9, 2008. U.S. application Ser. No. 12/620,330 is also a continuation-in-part of U.S. application Ser. No. 12/234,307 filed Sep. 19, 2008, which is a non-provisional application of U.S. Provisional Application No. 61/033,064 filed Mar. 3, 2008. U.S. application Ser. No. 12/620,330 is also a continuation-in-part of U.S. application Ser. No. 12/234,360 filed Sep. 19, 2008, which is a non-provisional application of U.S. Provisional Application No. 61/053,713 filed May 16, 2008. U.S. application Ser. No. 12/620,330 is also a continuation-in-part of U.S. application Ser. No. 12/237,365 filed Sep. 24, 2008, which is a non-provisional application of U.S. Provisional Application No. 61/057,599 filed May 30, 2008. U.S. application Ser. No. 12/620,330 is also a continuation-in-part of U.S. application Ser. No. 12/235,200 filed Sep. 22, 2008, which is a non-provisional application of U.S. Provisional Application No. 61/076,126 filed Jun. 26, 2008. All aforementioned applications are hereby incorporated by reference in their entirety as if fully cited herein.

TECHNICAL FIELD

Exemplary embodiments generally relate to cooling systems for electronic displays.

BACKGROUND OF THE ART

Conductive and convective heat transfer systems for electronic displays are known. These systems of the past generally attempt to remove heat from the electronic components in a display through as many sidewalls of the display as possible. While such heat transfer systems have enjoyed a measure of success in the past, improvements to displays require even greater cooling capabilities.

In particular, cooling devices for electronic displays of the past have generally used convective heat dissipation systems that function to cool an entire interior of the display by one or more fans and fins, for example. By itself, this is not adequate in many climates, especially when radiative heat transfer from the sun through a display window becomes a major factor. In many applications and locations 200 Watts or more of power through such a display window is common. Additionally, modern applications call for larger displays than previous applications. For example, some outdoor applications call for forty-seven inch screens and above. With increased heat production from the larger screens and radiative heat transfer from the sun through the display window, more efficient and powerful heat dissipation systems are required.

SUMMARY OF THE EXEMPLARY EMBODIMENTS

A large fluctuation in temperature is common in the devices of the past. Such temperature fluctuation adversely affects the electronic components in these devices. Whereas the systems of the past attempted to remove heat only through the non-display sides and rear components of the enclosure surrounding the electronic display components, a preferred embodiment causes convective heat transfer from the face of the display as well. By the aspects described below, exemplary embodiments have made consistent cooling possible for electronic displays having screens of sizes greater than or equal to twelve inches. For example, cooling of a 55 inch screen can be achieved, even in extremely hot climates. Greater cooling capabilities are provided by the device and method described and shown in more detail below.

An exemplary embodiment relates to an isolated gas cooling system and a method for cooling an electronic display. An exemplary embodiment includes an isolated gas cooling chamber. The gas cooling chamber is preferably a closed loop which includes a first gas chamber comprising a transparent anterior plate and a second gas chamber comprising a cooling plenum.

The first gas chamber is anterior to and coextensive with the viewable face of the electronic display surface. The transparent anterior plate may be set forward of the electronic display surface by spacers defining the depth of the first gas chamber. A cooling chamber fan, or equivalent means, maybe located within the cooling plenum. The fan may be used to propel gas around the isolated gas cooling chamber loop. As the gas traverses the first gas chamber it contacts the electronic display surface, absorbing heat from the surface of the display. Because the gas and the relevant surfaces of the first gas chamber are transparent, the image quality would preferably remain excellent. After the gas has traversed the transparent first gas chamber, the gas may be directed into the rear cooling plenum.

In order to cool the gas in the plenum, external convective or conductive means may be employed. In at least one embodiment, an external fan unit may also be included within the housing of the display. The external fan unit may be positioned to provide a flow of ingested air over the external surfaces of the plenum. The heated air in the housing may exit the housing as exhaust.

The two chambers of the closed loop plenum encircle the electronic display. Within electronic displays is typically a backlight, especially in liquid crystal displays (LCD). The backlight can be a significant source of heat for the electronic display. Exemplary embodiments position the backlight sufficiently close to the wall of the cooling plenum so that convective heat transfer from the backlight can be increased. The external fan may force air between the plenum and the backlight or air may be pulled from the top of the display using an additional fan unit. Alternatively, a combination of both fans may be employed.

The foregoing and other features and advantages of the present invention will be apparent from the following more detailed description of the particular embodiments of the invention, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which.

DETAILED DESCRIPTION

Figure 1:
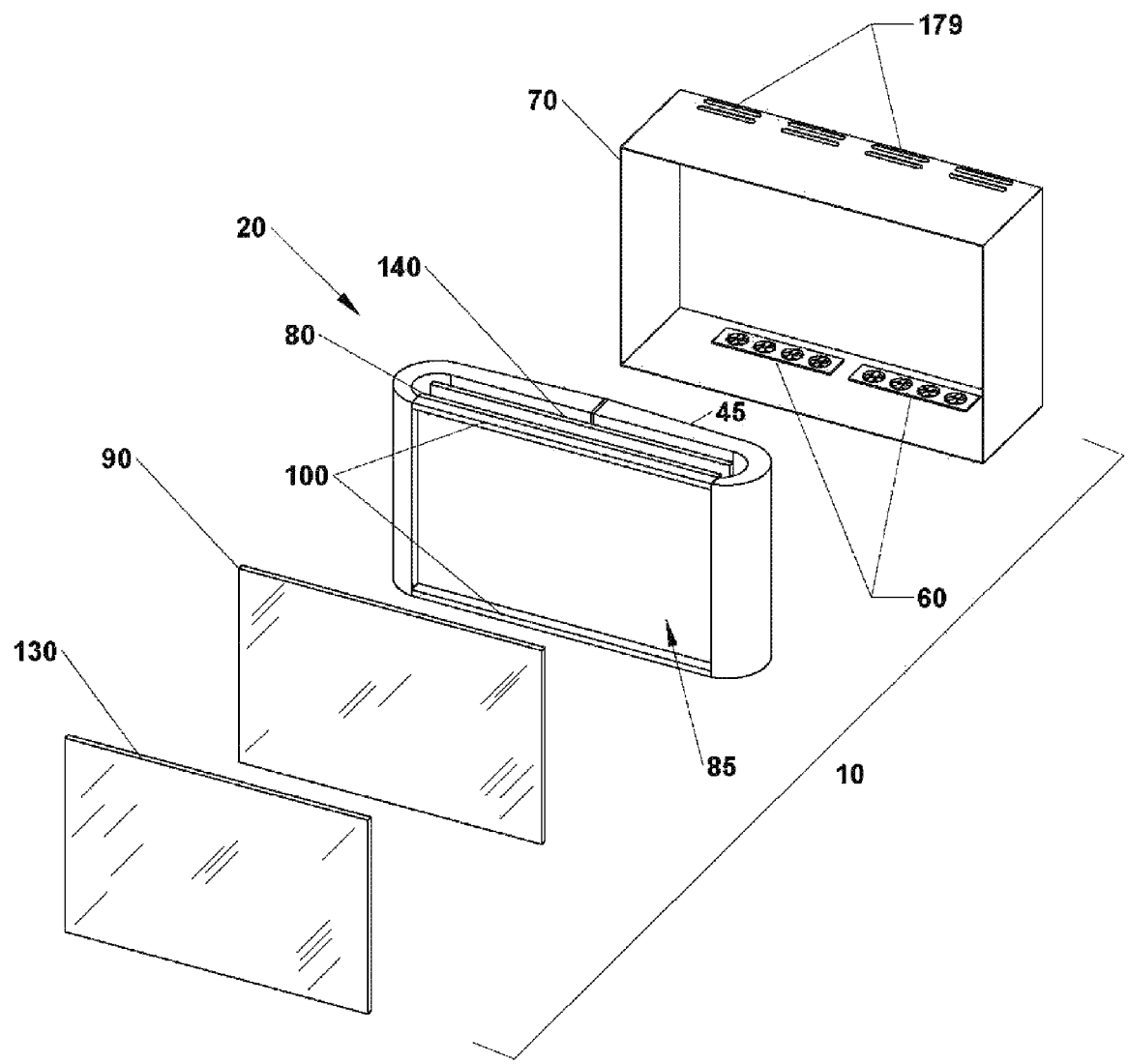
FIG. 1 is an exploded perspective view of an exemplary embodiment showing components of the isolated gas cooling system.

FIG. 1 is an exploded view of an exemplary embodiment of the closed loop cooling system. This system is fully described in co-pending U.S. application Nos. 61/033,064 and 61/053,713 herein incorporated by reference in their entirety.

It is to be understood that the disclosed embodiments includes the cooling of displays including, but not limited to LCDs. By way of example and not by way of limitation, the exemplary embodiments may be used in conjunction with displays selected from among LCD (including TFT or STN type), light emitting diode (LED), organic light emitting diode (OLED), field emitting display (FED), cathode ray tube (CRT), and plasma displays. Furthermore, embodiments may be used with displays of other types including those not yet discovered. In particular, it is contemplated that the exemplary embodiments may be well suited for use with full color, flat panel OLED displays. While the embodiments described herein are well suited for outdoor environments, they may also be appropriate for indoor applications (e.g., factory environments) where thermal stability of the display may be at risk.

An exemplary embodiment 10 of the electronic display and gas cooling system includes an isolated gas cooling chamber 20 contained within an electronic display housing 70. A narrow transparent first gas chamber may be defined by spacers 100 and transparent front plate 90. A second transparent front plate 130 may be laminated to front plate 90 to help prevent breakage of transparent plate 90. Cooling chamber 20 surrounds an electronic display 80 (in this case an LCD stack) and associated backlight panel 140 (although some embodiments may not require a backlight panel).

The gas cooling system 10 may include means for cooling gas contained within the cooling plenum 45. This means may include a fan 60 which may be positioned at the base of the display housing 70. The fan will force the cooler ingested air over at least one external surface of a posterior cooling plenum 45. If desired, an air conditioner (not shown) may also be utilized to cool the air which contacts the external surface of plenum 45. This air may be the same air that is forced between the backlight 145 and the surface of the plenum 45 in order to further cool the backlight 145.

Figure 2:
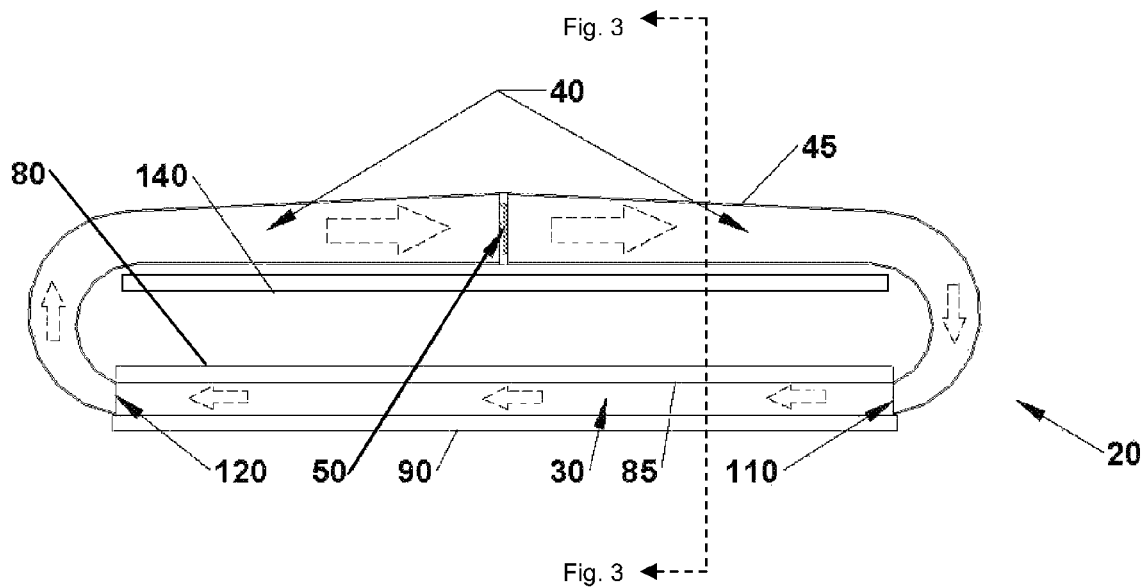
FIG. 2 is top sectional view of an exemplary embodiment of the cooling chamber.

Referring to FIG. 2, in at least one embodiment the isolated gas cooling chamber 20 comprises a closed loop which includes a first gas chamber 30 and a rear cooling chamber 40. The first gas chamber includes a transparent plate 90. The second gas chamber comprises a cooling plenum 45. The term "isolated gas" refers to the fact that the gas within the isolated gas cooling chamber 20 is essentially isolated from external air in the housing of the display. Because the first gas chamber 30 is positioned in front of the display image, the gas should be substantially free of dust or other contaminates that might negatively affect the display image.

The isolated gas may be almost any transparent gas, for example, normal air, nitrogen, helium, or any other transparent gas. The gas is preferably colorless so as not to affect the image quality. Furthermore, the isolated gas cooling chamber need not necessarily be hermetically sealed from the external air. It is sufficient that the gas in the chamber is isolated to the extent that dust and contaminates may not substantially enter the first gas chamber.

The first gas chamber 30 is in gaseous communication with the rear cooling chamber 40. A cooling chamber fan 50 may be provided within the posterior plenum 45. The cooling fan 50 may be utilized to propel gas around the isolated gas cooling chamber 20. The first gas chamber 30 includes at least one transparent plate 90 mounted in front of an electronic display surface 85. The transparent plate 90 may be set forward from the electronic display surface 85 by spacers 100. The spacing members 100 define the depth of the narrow channel passing in front of the electronic display surface 85. The spacing members 100 may be independent or alternatively may be integral with some other component of the device (e.g., integral with the front plate). The electronic display surface 85, the spacing members, and the transparent front plate 90 define a narrow first gas chamber 30. The chamber 30 is in gaseous communication with plenum 45 through entrance opening 110 and exit opening 120.

Figures 3A, 3B:
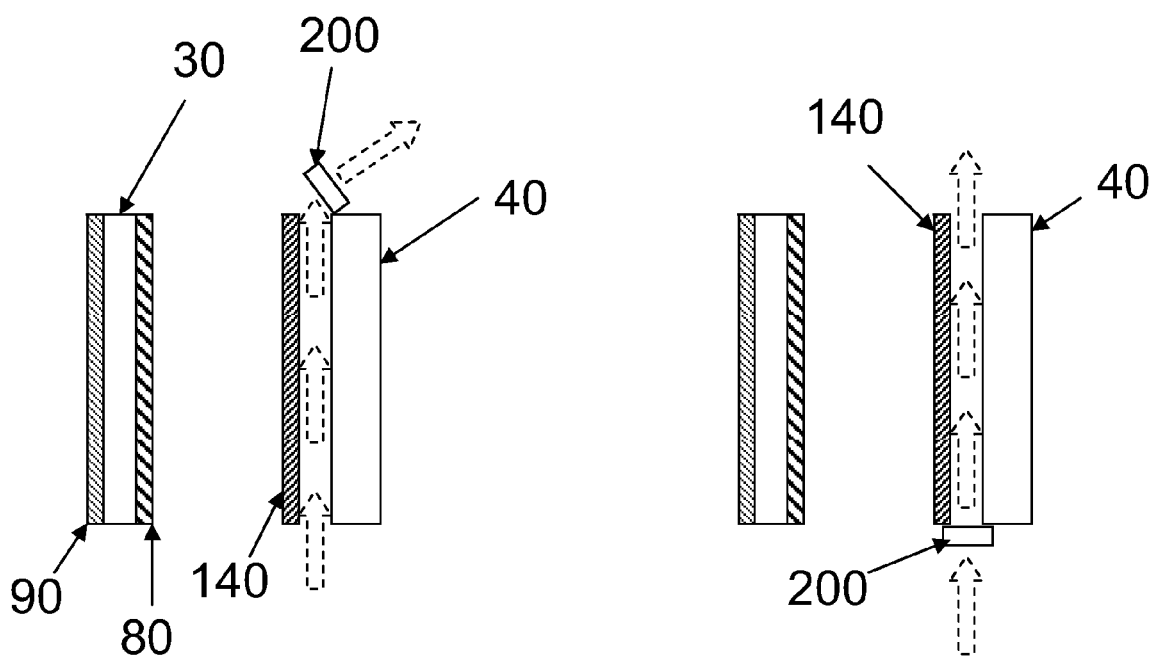
FIGS. 3A-3E are cross sectional views of exemplary embodiments using constricted convection cooling.

FIG. 3A shows a cross-sectional view of the section that is shown in FIG. 2. Towards the front of the display is the first gas chamber 30 which abuts against the electronic display 80. In front of the first gas chamber 30 is the transparent plate 90. Towards the rear of the display, the backlight 140 is placed in close proximity to the posterior rear cooling chamber 40. The close proximity of these two elements, in part, creates the constricted convection cooling of the backlight 140. One or more constricted convection fans 200 may be used to draw air between the backlight 140 and the rear cooling chamber 40. It has been found that forcing air through a smaller space increases the cooling abilities of the system. The distance between the backlight 140 and the rear cooling chamber 40 may vary depending on many factors, including but not limited to: the size of the display, the design of the backlight assembly, the desired operating environment, and the size and speed of the selected constricted convection fans. An ideal distance may be between 0.25 and 1.25 inches. Alternatively, an ideal distance may be between 0.33 and 2.5 inches. Larger distances may be preferable, depending at least upon the many factors listed above.

The backlight may comprise a printed circuit board (PCB) with a plurality of lights mounted to the side facing the electronic display 80. The lights in the backlight may be any one of the following: LED's, organic light emitting diodes (OLED), field emitting display (FED), light emitting polymer (LEP), or organic electro-luminescence (OEL) lights. In an exemplary embodiment, the backlight 140 would ideally have a low level of thermal resistance between the side facing the electronic display 80 and the side facing the cooling plenum. To accomplish this low level of thermal resistance, the backlight 140 may be built using metal printed circuit board (PCB) technology to further transfer heat away from the lights. The rear surface of the backlight 140 may also be metallic, or some other thermally conductive material, to further enhance the convective heat transferring properties. The surface may even have a plurality of surface features such as fins to further enhance the convective heat transferring properties. The constricted convection fan 200 may then send the warm air out of an exhaust 179 (shown in FIG. 1) so that it may exit the display housing entirely.

Figure 3C:
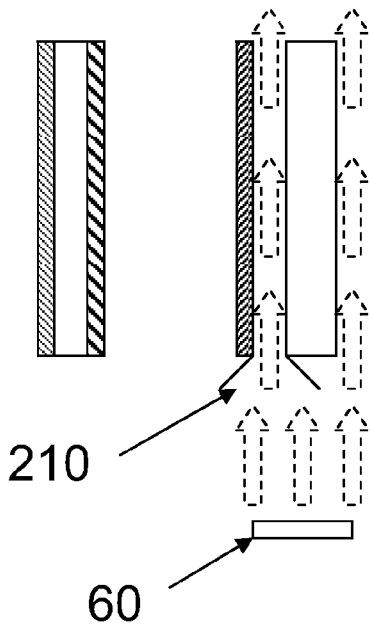

FIG. 3B shows another cross-sectional view of another embodiment for the constricted convection setup. In this embodiment, the constricted convection fan 200 is used to push air between the backlight 140 and the rear cooling chamber 40. FIG. 3C shows an embodiment without the constricted convection fan, but instead uses the fan 60 which draws air from outside the display housing. As noted above, this air may simply be ambient air or alternatively this air may come from a conditioning unit (not shown). To facilitate the flow of air between the backlight 140 and the rear cooling chamber 40, a guiding device 210 may be used.

Figure 3D:
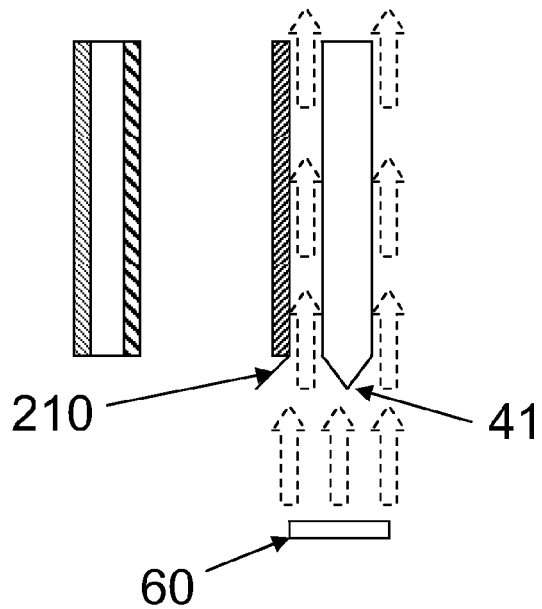
Figure 3E:
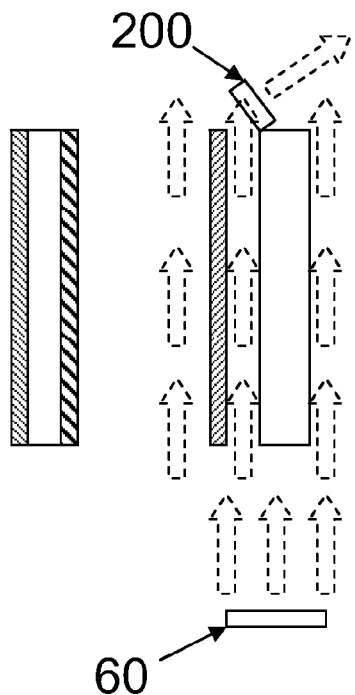

FIG. 3D shows another embodiment, where the rear cooling chamber 40 contains a guiding feature 41, which is used in combination with the guiding device 210 to facilitate the flow of air between the backlight and the cooling chamber. FIG. 3E shows another embodiment, where both the fan 60 and the constricted convection fan 200 is used. This embodiment could also utilize a version of the guiding devices shown in FIGS. 3C and 3D.

While the display is operational, the fan 60 and the constricted convection fan 200 may run continuously. However, if desired, a temperature sensor (not shown) and a switch or microcontroller (not shown) may be incorporated within the electronic display. This effective thermostat may be used to detect when temperatures have reached a predetermined threshold value. In such a case, the various fans may be selectively engaged when the temperature in the display reaches a predetermined value. Predetermined thresholds may be selected and the system may be configured with a thermostat (not shown) to advantageously keep the display within an acceptable temperature range. This would save on both energy costs as well as the useful lifetime of the devices.

An optional air filter (not shown) may be employed within the plenum to assist in preventing contaminates and dust from entering the first gas chamber 30. An air filter could also be used to prevent fan 60 from drawing in particulates from either the surrounding environment or the conditioning unit.

It should be noted, that some embodiments may not use display technology that requires a backlight. For these types of displays, the electronic display 80 would be placed anterior to the rear cooling chamber 40 (rather than the backlight 140). For example, an OLED may be placed anterior to the rear cooling chamber 40 so that cooling air could be forced between the posterior surface of the OLED and the rear cooling chamber 40.

Having shown and described the preferred embodiments, those skilled in the art will realize that many variations and modifications may be made to affect the embodiments and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

I claim:

1. A method for cooling an electronic display having a rear surface, comprising the steps of:
    placing a substantially planar surface adjacent to the rear surface of the electronic display to define a gap between the planar surface and the electronic display;
    placing a closed loop of circulating gas around the display;
    forcing a circulating gas around the closed loop; and
    forcing cooling air through said gap.

2. The method of claim 1 wherein:
    said gap is between 0.25 and 1.25 inches.

3. The method of claim 1 wherein:
    said gap is between 0.33 and 2.5 inches.

4. The method of claim 1 wherein:
    said substantially planar surface is provided by the wall of a cooling chamber.

5. The method of claim 1 wherein:
    said step of forcing cooling air through said gap is performed by a fan which draws ambient air through the gap.

6. The method of claim 1 wherein:
    said step of forcing cooling air through said gap is performed by a fan which pushes gas through the gap.

7. The method of claim 1 further comprising the step of:
    filtering the cooling air prior to forcing it through said gap.

8. A method for cooling an electronic display having a front surface and a gap defined between a rear surface of the electronic display and a second posterior surface, comprising the steps of:
    circulating gas around the display in a closed loop;
    allowing the gas to contact the front surface of the electronic display; and
    forcing cooling air through the gap
    where the cooling air is not permitted to mix with the circulating gas.

9. The method of claim 8 wherein:
    the step of circulating gas around the display in a closed loop is performed by
    a first gas chamber positioned anterior to the front surface of the electronic display;
    a second gas chamber in gaseous communication with said first gas chamber and positioned posterior to the rear surface of the electronic display; and
    a cooling chamber fan within said second gas chamber to propel gas around the first and second gas chambers.

10. The method of claim 9 wherein:
    the second posterior surface is defined by the second gas chamber.

11. The method of claim 8 wherein:
    said gap is between 0.25 and 1.25 inches.

12. The method of claim 8 wherein:
    said gap is between 0.33 and 2.5 inches.

13. The method of claim 8 wherein:
    said step of forcing cooling air through said gap is performed by a fan which draws ambient air through the gap.

14. The method of claim 8 wherein:
    said step of forcing cooling air through said gap is performed by a fan which pushes gas through the gap.

15. The method of claim 8 further comprising the step of:
    filtering the cooling air prior to forcing it through said gap.

16. A method for cooling an LED backlit liquid crystal display where the LED backlight contains a rear surface and the LCD contains a front viewing surface, and a posterior surface is spaced apart from the rear surface of the LED backlight to define a gap, the method comprising the steps of:
    circulating gas around the LCD and backlight in a closed loop;
    forcing cooling air through the gap; and
    preventing the circulating gas from mixing with the cooling air.

17. The method of claim 16 further comprising the step of:
    allowing the circulating gas to contact the front surface of the LCD.

18. The method of claim 16 wherein:
    the step of circulating gas around the LCD in a closed loop is performed by a first gas chamber positioned anterior to the front viewing surface of the LCD;
    a second gas chamber in gaseous communication with said first gas chamber and positioned posterior to the rear surface of the LED backlight; and
    a cooling chamber fan within said second gas chamber to propel gas around the first and second gas chambers.

19. The method of claim 18 wherein:
said gap is between 0.25 and 1.25 inches.
20. The method of claim 18 wherein:
said gap is between 0.33 and 2.5 inches.

* * * * *